Feb. 14, 1967 P. K. WEIMER 3,304,469
FIELD EFFECT SOLID STATE DEVICE HAVING A PARTIALLY INSULATED ELECTRODE
Filed March 3, 1964 2 Sheets-Sheet 1

INVENTOR.
PAUL K. WEIMER
BY
W. S. Hill
AGENT

INVENTOR.
PAUL K. WEIMER
BY
W.S. Hill
AGENT

United States Patent Office 3,304,469
Patented Feb. 14, 1967

3,304,469

FIELD EFFECT SOLID STATE DEVICE HAVING A PARTIALLY INSULATED ELECTRODE

Paul Kessler Weimer, Princeton, N.J., assignor to Radio Corporation of America, a corporation of Delaware Filed Mar. 3, 1964, Ser. No. 349,090
8 Claims. (Cl. 317—234)

This invention relates to improved solid state devices, and more particularly to improved solid state field-effect diodes.

I have previously described a solid state device comprising an insulating gate field-effect thin-film transistor. See P. K. Weimer, The TFT—A New Thin Film Transistor, Proc. IRE, vol. 50, pages 1462–1469, June 1962. In order to facilitate the fabrication of improved integrated circuits comprising thin-film transistors in combination with diodes, it is desirable to provide solid state thin-film diodes which can be formed with the same type of processing steps and at the same time as the aforesaid thin-film transistors.

It is an object of this invention to provide improved solid state devices.

Another object is to provide improved solid state diodes which can be prepared entirely by deposition of thin films on an insulating substrate.

Still another object is to provide novel and improved solid state field-effect diodes.

But another object is to provide improved thin-film field-effect diodes which are compatible with, and can be fabricated in a manner similar to certain types of thin-film transistors.

These and other objects are attained according to the invention by providing a solid state field-effect device comprising a layer of semiconductive material, a first electrode in contact with said semiconductive layer, a thin film of high resistivity material on a portion of one side of said semiconductive layer, and a second electrode which is partly over said high resistivity film and partly in contact with said semiconductive layer. The high resistivity film is less than two microns thick, and preferably between about .005 micron and about one micron thick. The film consists of a material selected from the group consisting of electrical insulators and wide band-gap semiconductors which exhibit high electrical resistivity. The gap between the two spaced electrodes is preferably between about 0.1 micron and about 250 microns. The various layers and electrodes of the device may be supported by an insulating substrate. The semiconductive layer, the high resistivity film, and the two spaced electrodes of the device may be arranged in various ways, as described below.

The invention and its features will be better understood from the following examples, considered in conjunction with the accompanying drawing, in which.

Similar reference numerals have been applied to similar elements in the drawing.

EXAMPLE I

Figure 1:
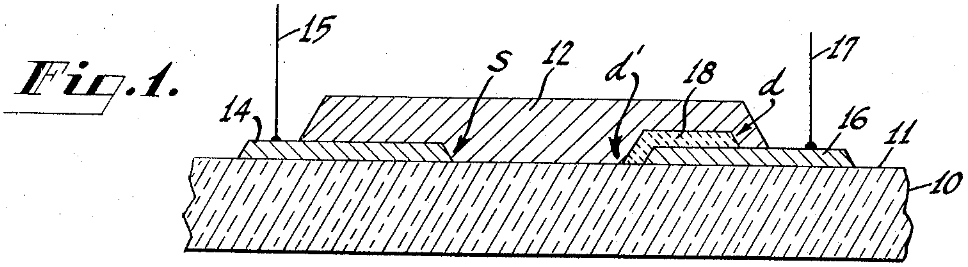
FIGURE 1 is a cross-sectional view of a solid state device according to one embodiment of the invention.

Referring now to FIGURE 1, a field-effect diode according to one embodiment of the invention may be prepared on an insulating support or substrate 10, which may consist of glass, fused quartz, ceramic, or the like. On one face 11 of substrate 10, there are provided two spaced electrodes 14 and 16. Electrodes 14 and 16 suitably consist of metals such as indium, gold, aluminum, tin, lead, alloys of these metals, and the like. The spaced electrodes may be deposited as thin films by any convenient technique, such as by masking and evaporation. Alternatively, a paste containing metallic particles may be painted or silk-screened on desired portions of face 11. The thickness of electrodes 14 and 16 may vary from about .005 microns to 0.5 microns. Other techniques, such as sputtering may also be used to deposit the two spaced electrodes. The gap or space between electrodes 14 and 16 is preferably between about 0.1 micron and about 250 microns. In this example, electrodes 14 and 16 both consist of gold, are about .05 microns thick, and are spaced so that their adjacent edges are about 8 microns apart. A method which has been found satisfactory for depositing two closely spaced electrodes with a specified gap therebetween is described below.

A high electrical resistivity film 18 is deposited on a portion of one electrode 16. The high resistivity film 18 may conveniently be deposited by evaporation. For efficient operation, the high resistivity film 18 should preferably be less than two microns thick. Advantageously, film 18 is about .005 to one micron thick. Materials which have been found particularly suitable for the high resistivity film 18 are insulators such as silicon monoxide, silicon dioxide, aluminum oxide, calcium fluoride, and the like. Materials which are usually classed as semiconductors, such as zinc sulfide, and the like, may also be utilized for the film 18, provided they exhibit high resistivity. A portion of the high resistivity film 18 is interposed in the direct path through semiconductive layer 12 between adjacent edges of electrodes 14 and 16. In this example, film 18 consists of silicon monoxide and is about .03 microns thick.

A layer 12 of semiconductive material is then deposited on the aforesaid face 11 of insulating support 10 so as to cover part of electrode 14, the gap between electrodes 14 and 16, the high resistivity film 18, and part of electrode 16. The semiconductive material utilized for layer 12 is a crystalline substance which exhibits a periodic potential field, at least on an atomic scale, and may be either monocrystalline or polycrystalline. Semiconductive layer 12 is preferably between about .005 and about 25 microns thick. Suitable semiconductive materials for the layer 12 include elemental semiconductors such as germanium, silicon, and germanium-silicon alloys; III–V compound semiconductors such as the phosphides, arsenides and antimonides of aluminum, indium and gallium; and II–VI compounds such as the sulfides, selenides and tellurides of zinc and cadmium. Zinc oxide may also be classed as a II–VI compound. The energy gap and the electrical resistivity of some wide gap II–VI compounds, for example, zinc sulfide, are sufficiently high so that these materials may be regarded as insulators rather than semiconductors, and may be used as the high resistivity film 18. In this example, the semiconductive layer 12 consists of polycrystalline cadmium sulfide; the electrodes 14 and 16 both consist of gold and both make ohmic contacts to the semiconductor layer 12; and the high resistivity film 18 consists of silicon monoxide.

The two electrodes 14 and 16 need not both consist of the same material. However, the materials used for the semiconductive layer 12 and the one electrode 14 which is entirely in direct contact to the semiconductor 12 should be selected so that the electrode 14 makes an ohmic contact to semiconductor 12. An ohmic contact is one which is conductive for majority carriers in both directions, i.e., is conductive when the contact or electrode is biased positively and the semiconductor is biased negatively, and is also conductive when the electrode is biased negatively and the semiconductor is biased positively.

The other electrode 16, which is partly in contact with the semiconductor 12 and partly insulated from the semiconductor 12 by the high resistivity film 18, may also consist of material which makes an ohmic contact to the semiconductor, as in this example. Alternatively, electrode 16 may make a rectifying contact to the semiconductor 12. A rectifying contact between an N-type semiconductor, such as cadmium sulfide, and a large work function metal, such as platinum, is one in which the flow of majority charge carriers is blocked from entering the semiconductor when the semiconductor is biased positively with respect to the electrode. When the potential of the rectifying electrode is made positive with respect to the semiconductor, a large flow of electrons from the semiconductor to the electrode occurs. When a high resistivity material, for example an insulator such as aluminum oxide, or a wide gap semiconductor such as zinc sulfide, is interposed between a metal electrode and a semiconductor, the high resistivity material acts as a potential barrier, and prevents the flow of electrons either from the metal to the semiconductor or from the semiconductor to the metal through the high resistivity material.

One electrical lead wire 115 may be attached to electrode 14, and another electrical lead wire 17 to electrode 16. The lead wires 15 and 17 may conveniently be bonded to electrodes 14 and 16 respectively by a silver paste. Alternatively, when the diode is to be part of an array, or of an integrated circuit comprising a plurality of diodes and other solid state devices such as thin film transistors and the like, the lead wires 15 and 17 may be omitted, and suitable connections to other devices made by evaporating conductive metal strips as extensions of electrodes 14 and 16 to the terminals of other units deposited on the same substrate 10.

The rectifying action of the field-effect diode may be explained as follows:

Consider first the case of an N-type semiconductor 12, such as cadmium sulfide and the like, which has an electrical conductivity that is sufficiently great to give an appreciable current between the electrodes 14 and 16 when the drain electrode 16 is biased positively with respect to the source electrode 14. The principal electron flow in the semiconductor is along the bottom surface of the semiconductor from the inner edge (labeled small "*s*" in FIGURE 1) of the source electrode 14 to the closest point of contact (labeled small "*d*") of the drain electrode 16 with the semiconductor layer 12. No direct flow of electrons through the semiconductor can occur from the inner edge *s* of the source electrode 14 to the point *d'* on the drain electrode 16 which is closest to *s* because of the presence of the high resistivity film 18 in the direct path through semiconductive layer 12 between the electrode 16 and the semiconductor layer 12 at *d'*.

The current flow in the semiconductor layer 12 gives rise to a voltage drop along the lower surface of the semiconductor layer 12 from point *d* on the drain electrode 16 (at +V volts) to point *s* on the source electrode 14 (at 0 volts). Therefore, the portion of semiconductor layer 12 lying directly over the high resistivity film 18 (the portion between *d* and *d'*) is somewhat negative with respect to the underlying drain electrode 16. The effect of the underlying drain electrode 16 therefore is to enhance the conductivity of the portion of semiconductor layer 12 over the drain electrode 16, thereby increasing the drain current still more by field-effect action. This polarity of drain voltage (positive with respect to the source electrode 14) is called the forward-biased condition of the diode.

In the reverse-bias condition, the partially insulated drain electrode 16 is placed at a negative potential relative to the grounded source electrode 14. Electrons now tend to flow along the bottom surface of semiconductor layer 12 from drain electrode 16 to source electrode 14. However, the voltage drop in the semiconductive layer 12 is such as to make the portion of semiconductor layer 12 between electrodes 14 and 16 positive with respect to the electrode 16. In this case, the field-effect action of electrode 16 is such as to reduce the conductivity of that portion of semiconductor layer 12 which lies over the insulated portion of electrode 16, thus holding the drain current to a very low value. This polarity of applied voltage is called the reverse-bias condition.

If the semiconductor layer 12 is P-type, the same reasoning can be used to explain the field-effect action of the partially insulated electrode 16 upon the hole conductance in the P-type semiconductor. In this case, the forward direction of the diode is that in which the partially insulated electrode 16 is negative with respect to electrode 14, while the reverse bias direction occurs when electrode 16 is positive with respect to electrode 14.

It is to be noted that the rectifying action of the diode of Example I was obtained entirely by field-effect modulation of a semiconducting layer 12, and not by the use of dissimilar materials for the two electrodes 14 and 16. In conventional diodes, one electrode is ohmic, and the other is rectifying, while in the device of this example, both contacts are ohmic. This feature permits simplification of the fabrication of integrated circuits, since field-effect diodes can be evaporated simultaneously with thin film triodes on the same insulating substrate. Moreover, when diodes are made in the conventional manner, requiring one electrode to make a rectifying contact with the semiconductor, an additional evaporation and more processing steps are required over that of the present diodes.

A further advantage of the thin film field-effect diode over conventional rectifying contact thin film diodes is that the ratio of forward conductance to capacitance appears to be somewhat higher in the field-effect diodes. It may be noted, that for some applications requiring the maximum ratio of forward to reverse current, it may be desirable to combine the action of the field-effect and of the rectifying contact by utilizing for the partially insulated electrode 16 a material which makes a rectifying contact to the semiconductive layer 12.

As mentioned above, the thin films utilized may be deposited by any convenient technique. While evaporation is presently the most useful method of depositing uniform thin films, other processes, such as sputtering, may also be employed.

It can be shown that the upper limit on high frequency performance is related to the average transit time for charge carriers moving in the active semiconductive layer 12 between the two spaced electrodes 14 and 16. The transit time can be reduced either by increasing the mobility of majority charge carriers in the semiconductive layer, or by reducing the gap or spacing between the two electrodes.

The narrow gap or separation between the two spaced electrodes 14 and 16 can be precisely controlled in the following manner by a two-step evaporation process. A stretched wire held in a frame (not shown) is utilized as an evaporation mask. The wire may, for example, be one mil thick. For high precision, the stretched wire is preferably untwisted, and has been drawn through a die. A metal such as gold is then evaporated on an insulating support maintained very closely beneath the wire. The support may, for example, be a glass slide. After the first evaporation step, there are formed on one face of the glass slide two gold films with a gap one mil wide between them. The frame is now moved a short distance (a distance less than the diameter of the wire) transversely to the gap, and parallel to the one face of the glass silde, by means of a precision screw. A second evaporation of gold on the glass slide is then performed. During the second evaporation, some gold is deposited on a portion of the gap which was previously masked by the wire. The width of the gap can thus be reduced by an amount much less than the thickness of the stretched wire used as the mask. A gap or separation as small as approximately one micron can be obtained between the two evaporated electrodes in this manner. A frame holding a plurality of stretched wires may be utilized when a plurality of gaps is desired, as in the deposition of an array of devices on a single substrate. The method depends on imparting relative motion between the wire mask and the support. The method may also be performed by keeping the frame and stretched wire in a fixed position, and moving the insulating support or substrate relative to the wire. Alternatively, both the wire and the support may be moved.

In the embodiment described in Example I, the various device components were arranged so that the two spaced electrodes 14 and 16 rest directly on the insulating substrate 10, and both electrodes are beneath the semiconductive layer 12, making contact to the lower surface of the semiconductive layer.

The arrangement of the device components may be reversed, so that the two spaced electrodes 14 and 16 are in contact with the upper surface of semiconductive layer 12, as described in the next example.

EXAMPLE II

Figure 2:
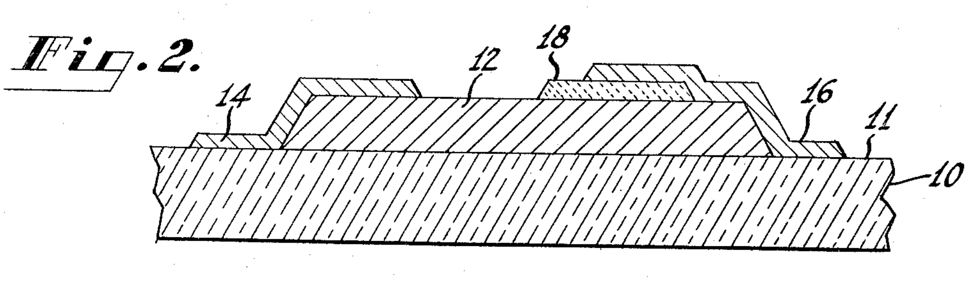
FIGURES 2–8 are cross-sectional views of field-effect diodes according to the other embodiments of the invention; and, FIGURE 9 is a plot of the output current versus the applied voltage for a diode according to the invention.
Figure 3:
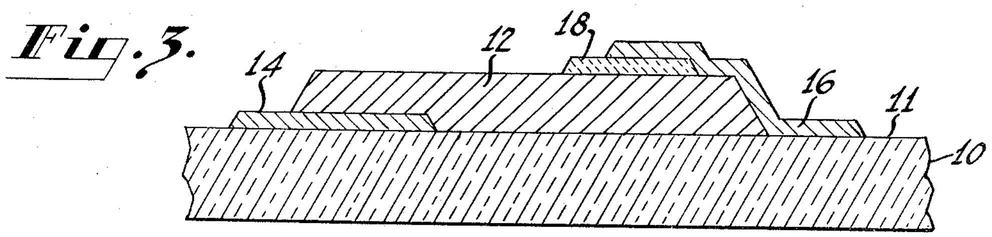

Referring now to FIGURE 2, a solid state field-effect diode according to another embodiment of the invention is provided by depositing a crystalline semiconductive layer 12 on one face 11 of an insulating support 10. The semiconductive layer 12 may consist of any of the crystalline semiconductive materials mentioned in Example I above. In this example, the semiconductive layer 12 consists of cadmium selenide, and is about 0.2 micron thick.

A high resistivity film 18 is deposited on a first portion of the exposed surface of semiconductive layer 12. The film 18 may consist of any of the high resistivity materials mentioned in Example I above. In this example, film 18 consists of aluminum oxide and is about .02 micron thick.

A first metallic electrode 14 is deposited by any convenient method on a second portion of the exposed surface of semiconductive layer 12, and in direct contact therewith. The electrode 14 may consist of any of the metals or alloys mentioned in Example I above which makes an ohmic contact to the cadmium selenide utilized in this embodiment. In this example, electrode 14 consists of aluminum, and is about .05 micron thick.

A second metallic electrode 16 spaced from the first electrode 14 is deposited on a portion of insulating films 18, and also on a portion of the exposed upper surface of semiconductive layer 12. The second electrode 16 also consists of aluminum in this example, and is also about .05 micron thick. The two electrodes 14 and 16 are spaced with adjacent edges a distance between about 0.1 to about 250 microns apart. The lateral gap or separation between electrodes 14 and 16 may be controlled by the masking and evaporating techniques described above.

It desired, a pair of electrical lead wires (not shown) may be attached to electrodes 14 and 16 respectively, in a manner similar to Example I above. Alternatively, strips of conductive material (not shown) may be deposited from each of electrodes 14 and 16 over face 11 of substrate 10 to other solid state devices deposited on the substrate. The showing of electrical lead wires or connections is omitted in the devices illustrated in FIGURES 2–8.

EXAMPLE III

In the devices of Examples I and II, the electrodes 14 and 16 are on the same side of semiconductive layer 12. A device embodying the invention may be fabricated in a staggered arrangement, with one electrode on one side of the semiconductive layer, and the other electrode on the other side of the semiconductive layer, as described in the following two examples.

A first metallic electrode 14 (FIGURE 3) is deposited by any convenient method on one face of insulating substrate 10. Electrode 14 may consist of any of the metals or alloys mentioned in Example I.

A layer 12 of crystalline semiconductive material is deposited on face 11 of substrate 10 so as to cover a portion of electrode 14. The semiconductive layer 12 may consist of any of the semiconductive materials mentioned in Example I above, but the materials of electrode 14 and of semiconductive layer 12 should be selected so that the contact between them is ohmic in character. In this example semiconductive layer 12 consists of cadmium sulfide, and electrode 14 consists of aluminum, which makes an ohmic contact to the cadmium sulfide layer.

A film 18 of high resistivity material is deposited on a portion of the exposed upper surface (as viewed in FIGURE 3) of semiconductive layer 12. Film 18 may consist of any of the high resistivity materials mentioned in Example I. In this embodiment, film 18 consists of calcium fluoride, and is about .05 micron thick.

A second metallic electrode 16 having its adjacent edge between about 0.1 and about 250 microns from the first electrode 14 is deposited on a portion of high resistivity film 18, and also on a portion of the exposed upper surface of semiconductive layer 12. The second electrode 16 consists of platinum in this example, and makes a blocking contact to the semiconductive layer 12. Accurate control of the lateral gap between electrodes 14 and 16 may be obtained by the wire masking and evaporating techniques described above. In the device of this example, electrodes 14 and 16 are on opposite sides of semiconductive layer 12. Electrical connections are subsequently made to electrodes 14 and 16, utilizing either electrical lead wires as in Example I, or strips of conductive metal.

EXAMPLE IV

Figure 4:
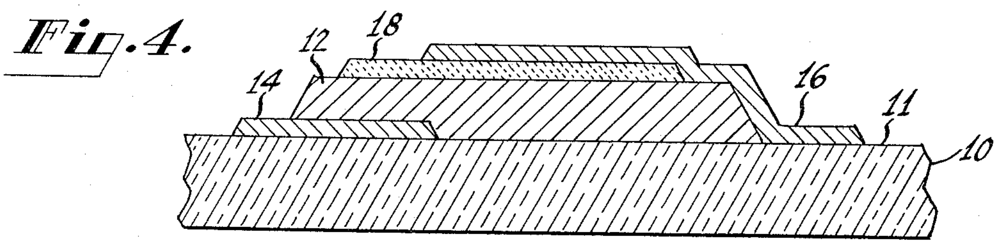

Referring now to FIGURE 4, a solid state field-effect diode may be provided in a staggered configuration by depositing a first metallic electrode 14 on one side 11 (the upper side as viewed in FIGURE 4) of insulating support 10; depositing a layer 12 of crystalline semiconductive material on said one face 11 of substrate 10 so as to cover a portion of electrode 14; depositing a film 18 of high resistivity material on a portion of the exposed upper surface of semiconductive layer 12; and depositing a second metallic electrode 16 on a portion of high resistivity film 18, and also on a portion of the exposed upper surface of semiconductive layer 12. However, in this embodiment, the adjacent edges of electrodes 14 and 16 are positioned so as to just overlap vertically. The electrodes 14 and 16 are thus separated by the combined thickness of the semiconductive layer 12 and the high resistivity film 18. In devices according to this embodiment, the interelectrode capacitance is increased, as compared to the embodiment described in Example III.

The embodiments of Examples V–VII may be described as sandwich field-effect diodes, since one device electrode is wrapped around opposing sides of the semiconductive layer.

EXAMPLE V

Figure 5:
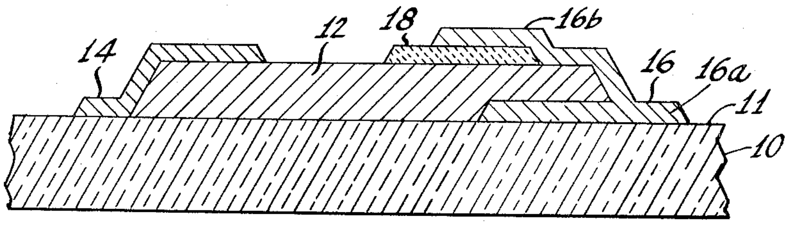

Referring now to FIGURE 5, a solid state field-effect diode may be provided in a sandwich configuration by depositing a portion of a first metallic electrode **16*a* on one face 11 of an insulating substrate or support 10; depositing a layer 12 of crystalline semiconductive material on said one face 11 of substrate 10 so as to cover a portion of the electrode portion 16*a* and of said one face 11; depositing a second metallic electrode 14 on one portion of the exposed upper side of semiconductive layer 12; depositing a film 18 of high resistivity material on a second portion of the exposed upper side of semiconductive layer 12; and depositing a metallic electrode 16b on a portion of the high resistivity film 18 and on a portion of the exposed upper side of semiconductive layer 12, the aforesaid electrode 16b merging with the first metallic electrode 16a to form a single electrode 16 wrapped around opposing sides of semiconductive layer 12**.

EXAMPLE VI

A solid state field-effect diode may be provided in another sandwich configuration by depositing two spaced metallic electrodes 14 and 16a (FIGURE 6) on one face 11 of an insulating support or substrate 10; depositing a layer 12 of crystalline semiconductive material on said one face 11 so as to cover portions of said electrons 14 and 16a, and also the gap between said electrodes; depositing a film 18 of high resistivity material on a portion of the exposed upper side of semiconductive layer 12; and depositing a metallic electrode 16b on a portion of the said high resistivity film 18 and on a portion of the exposed upper side of said semiconductive layer 12, said electrode 16b merging with the exposed portion of one said spaced electrode 16a to form a single electrode 16 wrapped around both sides of said semiconductive layer 12.

In the previous example illustrated in FIGURE 5, the high resistivity film 18 and the electrode 14 are on the same side of semiconductive layer 12. In the present embodiment (FIGURE 6) the high resistivity film 18 and the electrode 14 are on opposite sides of semiconductive layer 12.

EXAMPLE VII

A solid state field-effect diode is provided by depositing two metallic electrodes 14 and 16a (FIGURE 7) on one face 11 of an insulating support or substrate 10; depositing a layer 12 of crystalline semiconductive material on said one face 11 so as to cover portions of said electrodes 14 and 16a, and also cover the gap between said electrodes; depositing a film 18 of high resistivity material on a portion of the exposed upper side of semiconductive layer 12; and depositing a metallic electrode 16b on a portion of the said high resistivity film 18 and on a portion of the exposed upper side of said semiconductive layer 12, said electrode 16b on said film merging with the exposed portion of one said spaced electrode 16a to form a single electrode 16 wrapped around opposing sides of semiconductive layer 12. However, in this embodiment, as compared, for example, to that of FIGURE 6, the adjacent edges of electrode 14 on the lower side of semiconductive layer 12 and of electrode 16b on the high resistivity film 18 overlap vertically as viewed in FIGURE 7. The electrodes 14 and 16 in this embodiment are thus separated by the combined thickness of semiconductive layer 12 and high resistivity film 18. The device of this embodiment is similar in this respect to the device of Example IV (FIGURE 4).

Figure 6:
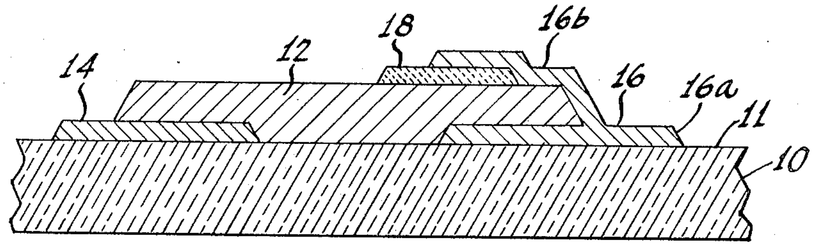
Figure 7:
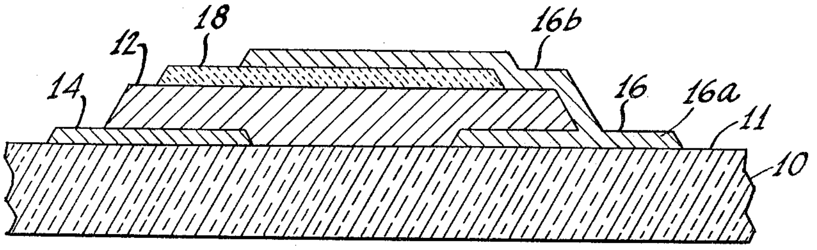
Figure 8:
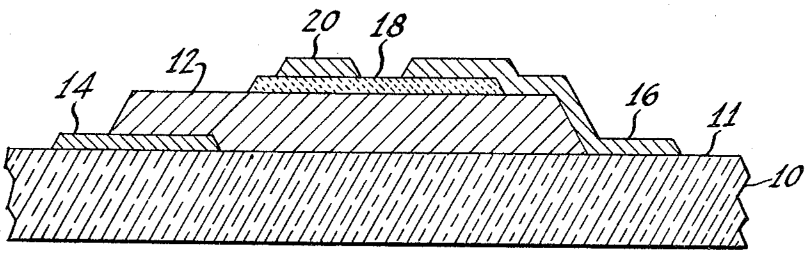
Figure 9:
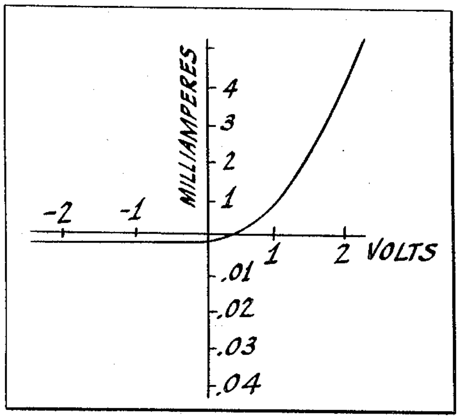

The rectification ratio (ratio of current in the forward direction to current in the reverse direction for a given applied voltage in the two directions) can be made as high as $10^6$ for the field-effect diodes in any of the examples according to the above embodiments. FIGURE 9 is a plot showing the variation in current with applied voltage for a field-effect diode comprising a layer of cadmium sulfide on a glass substrate, a high resistivity calcium fluoride film on the cadmium sulfide layer, and two spaced aluminum electrodes on the cadmium sulfide layer, one electrode being partly in contact with the cadmium sulfide layer and partly over the calcium fluoride film. The semiconductive cadmium sulfide layer, the high resistivity calcium fluoride film, and the two spaced electrodes in this device were arranged on an insulating support as illustrated in FIGURE 6. Since the current in the reverse direction is small compared to the current in the forward direction, the scale of the graph ordinate in FIGURE 9 is changed from milliamperes above zero to hundredths of milliamperes below zero.

EXAMPLE VIII

The characteristics of a field-effect diode and of a thin film transistor are combined in the device of this example.

A solid state device is provided by depositing a first metallic electrode 14 (FIGURE 8) on one face 11 of an insulating support or substrate 10; depositing a layer 12 of crystalline semiconductive material on said one face 11 of substrate 10 so as to cover a portion of electrode 14; depositing a film 18 of high resistivity material on a portion of the exposed upper side of semiconductive layer 12; depositing a second metallic electrode 16 on a first portion of high resistivity film 18, and also on a portion of the exposed upper side (as viewed in FIGURE 8) of semiconductive layer 12; and depositing a third metallic electrode 20 on a second part of high resistivity film 18 between electrodes 14 and 16. The first electrode 14 may serve as the source; the second electrode 16 may serve as the drain; and the third electrode 20 may serve as the gate. If desired, electrical lead wires (not shown) may be attached to electrodes 14, 16 and 20. Alternatively, these electrodes may be electrically connected to other devices on the same substrate by depositing strips of conductive metal (not shown) from each electrode over face 11 of substrate 10 to the electrodes of other devices.

The operating characteristics of the thin film transistor shown in FIGURE 9 differ from that of the conventional Thin Film Transistor in that useful currents are obtained only if the partially insulated electrode is positively biased for an N-type semiconductor, or negatively biased for a P-type semiconductor. With the opposite voltages applied, substantially no current is obtained. A conventional thin film transistor, as described in the Weimer publication previously mentioned, has the same characteristics regardless of which electrode is positively biased.

It will be understood that the above examples are by way of illustration only and not limitation. Other materials may be utilized for the substrate, the semiconductive layer, the high resistivity film, and the electrodes. The semiconductive layer 12 may consist of evaporated tellurium, which is a P-type semiconductor. In the sandwich construction illustrated in FIGURES 5, 6 and 7, the electrode 16 may consist of two different metals, for example aluminum for that portion 16a of electrode 16 which is directly on face 11 of the support 10, and gold for that portion 16b of electrode 16 which is on the high resistivity film 18 and on the upper surface of semiconductive layer 12. In the diodes illustrated in FIGURES 2, 3 and 4, the electrode 16 may be partially underneath the high resistivity film 18, as well as partially over it. Various other modifications may be made without departing from the spirit and scope of the invention as described in the specification and appended claims.

What is claimed is:

1. A field-effect diode comprising:

a layer of semiconductive material of single conductivity type;

a film of high resistivity material on a portion of one side of said semiconductive layer;

two metallic electrodes only, including a first metallic electrode in contact with said semiconductive layer and making an ohmic contact thereto;

and a second metallic electrode having a portion thereof which makes either a blocking contact or an ohmic contact to said semiconductive layer and defines with said first metallic electrode the ends of a current path through said semiconductive layer, said second metallic electrode having another portion thereof extending adjacent a portion of said current path and separated from said semiconductive layer by said film of high resistivity material.

2. A field-effect diode comprising:
one layer only of a single conductivity type semiconductive material;
a film of high resistivity material selected from the group consisting of silicon monoxide, silicon dioxide, calcium fluoride, zinc sulfide, and magnesium oxide on a portion of one side of said semiconductive layer;
two electrodes only, including a first metallic electrode in contact with said semiconductive layer;
and a second metallic electrode having a portion thereof in contact with said semiconductive layer and defining with said first electrode the ends of a current path through said semiconductive layer, said second electrode having another portion thereof extending adjacent a portion of said current path and separated from said semiconductive layer by said film of high resistivity material, both said electrodes making an ohmic contact to said semiconductive layer.

3. A field-effect diode comprising:
an insulating substrate;
a layer of single conductivity type semiconductive material on at least one face of said substrate;
a film of high resistivity material less than two microns thick on a portion of one side of said semiconductive layer;
two electrodes only, including a first metallic electrode in contact with said semiconductive layer;
and a second metallic electrode having a portion thereof in contact with said semiconductive layer and defining with said first electrode the ends of a current path through said semiconductive layer, said second electrode having another portion thereof extending adjacent a portion of said current path and separated from said semiconductive layer by said film of high resistivity material.

4. A field-effect diode comprising:
an insulating substrate;
two metallic electrodes only, each of said electrodes being on one side of said substrate and having a gap therebetween;
a film of high resistivity material on a portion of one said electrode and extending onto said substrate in the region of said gap;
and a layer of crystalline semiconductive material on said one face of said substrate, said layer covering said high resistivity film, a portion of each said electrode, and the gap between said electrodes.

5. A field-effect diode comprising:
an insulating substrate;
a first metallic electrode on one face of said substrate;
a layer of crystalline semiconductive material on said one face of said substrate, said layer covering a portion of said first electrode;
a film of high resistivity material on a portion of the exposed upper surface of said semiconductive layer;
and a second electrode having a portion thereof in contact with said semiconductive layer and defining with said first electrode the ends of a current path through said semiconductive layer, said second electrode having another portion thereof extending adjacent a portion of said current path and separated from said semiconductive layer by said film of high resistivity material.

6. A field-effect diode comprising:
an insulating substrate;
a first metallic electrode on one face of said substrate;
a second metallic electrode on said one face spaced close to said first electrode;
a layer of crystalline semiconductive material on said one face of said substrate, said layer covering a portion of said first and second electrodes, and the portion of said substrate therebetween;
a film of high resistivity material on a portion of the exposed upper surface of said semiconductive layer;
and an electrode on a portion of said film and on a portion of the exposed upper surface of said semiconductive layer, said electrode on said film connecting with said second electrode to form a single electrode on both sides of said semiconductive layer, the inner edge of said first electrode being overlapped by said high resistivity film and a portion of said electrode on said film.

7. A solid state field-effect device comprising:
a layer of semiconductive material of single conductivity type;
a film of high resistivity material on a portion of one side of said semiconductive layer;
a first electrode in contact with said semiconductive layer; and
a second electrode having a portion thereof in contact with said semiconductive layer and defining with said first electrode the ends of a current path through said semiconductive layer, said second electrode having another portion thereof extending adjacent a portion of said current path and separated from said semiconductive layer by said film of high resistivity material.

8. A solid state field-effect device as defined in claim 7 further comprising:
a third electrode extending adjacent to said current path and separated from said semiconductive layer by said film.

References Cited by the Examiner

UNITED STATES PATENTS

| | | | |
|---|---|---|---|
| 2,900,531 | 8/1959 | Wallmark | 317—235 |
| 2,954,486 | 9/1960 | Doucette et al. | 317—235 |
| 2,983,631 | 5/1961 | Hanlet | 317—235 |
| 3,063,023 | 11/1962 | Dacey et al. | 317—235 |
| 3,094,650 | 6/1963 | Riegert | 317—235 |
| 3,097,308 | 7/1963 | Wallmark | 317—235 |
| 3,109,942 | 11/1963 | Luscher | 307—88.5 |
| 3,184,659 | 5/1965 | Cohen | 317—234 |
| 3,237,061 | 2/1966 | Gaertner et al. | 317—234 |
| 3,254,276 | 5/1966 | Schwarz et al. | 317—234 |

FOREIGN PATENTS

| | | |
|---|---|---|
| 1,037,293 | 4/1953 | France. |
| 1,361,215 | 4/1964 | France. |

OTHER REFERENCES

The TFT—A New Thin Film Transistor, Proc. IRE, vol. 50, pages 1462–1469 (June 1962).

JOHN W. HUCKERT, *Primary Examiner.*

J. D. CRAIG, *Assistant Examiner.*